(12) United States Patent
Jagt

(10) Patent No.: US 8,471,281 B2
(45) Date of Patent: Jun. 25, 2013

(54) SIDE EMITTING DEVICE WITH HYBRID TOP REFLECTOR

(75) Inventor: Hendrik Johannes Boudewijn Jagt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 197 days.

(21) Appl. No.: 12/746,775

(22) PCT Filed: Dec. 5, 2008

(86) PCT No.: PCT/IB2008/055120
§ 371 (c)(1),
(2), (4) Date: Jun. 8, 2010

(87) PCT Pub. No.: WO2009/074934
PCT Pub. Date: Jun. 18, 2009

(65) Prior Publication Data
US 2010/0258832 A1    Oct. 14, 2010

(30) Foreign Application Priority Data
Dec. 11, 2007    (EP) .................................... 07122856

(51) Int. Cl.
*H01L 33/00* (2010.01)
(52) U.S. Cl.
USPC ......... 257/98; 257/99; 257/100; 257/E33.061
(58) Field of Classification Search
USPC ................................ 257/98, 99, 100, E33.061
See application file for complete search history.

(56) References Cited

U.S. PATENT DOCUMENTS

| | | | |
|---|---|---|---|
| 5,537,433 A | 7/1996 | Watanabe | |
| 6,066,861 A | 5/2000 | Hohn et al. | |
| 7,285,802 B2 | 10/2007 | Ouderkirk et al. | |
| 7,378,686 B2 | 5/2008 | Beeson et al. | |
| 2004/0145308 A1 | 7/2004 | Rossner et al. | |
| 2005/0145867 A1 | 7/2005 | Yau et al. | |
| 2005/0269582 A1 | 12/2005 | Mueller et al. | |
| 2006/0092663 A1 | 5/2006 | Noh et al. | |
| 2006/0208269 A1 | 9/2006 | Kim et al. | |
| 2006/0273337 A1 | 12/2006 | Han et al. | |
| 2007/0001187 A1 | 1/2007 | Kim | |
| 2007/0047228 A1 | 3/2007 | Thompson et al. | |
| 2007/0086211 A1 * | 4/2007 | Beeson et al. | ............... 362/628 |
| 2007/0138494 A1 | 6/2007 | Pugh et al. | |
| 2007/0170454 A1 | 7/2007 | Andrews | |
| 2007/0182299 A1 * | 8/2007 | Ouderkirk et al. | ............. 313/110 |
| 2008/0074888 A1 * | 3/2008 | Chang | ........................... 362/327 |

FOREIGN PATENT DOCUMENTS

| | | |
|---|---|---|
| EP | 1204151 A1 | 5/2002 |
| EP | 1503434 | 2/2005 |
| WO | 2004097949 A1 | 11/2004 |
| WO | 2007047437 | 4/2007 |

* cited by examiner

Primary Examiner — Tan N Tran
(74) Attorney, Agent, or Firm — William S. Francos; Mark L. Beloborodov

(57) ABSTRACT

A side-emitting light emitting device (100) is provided, comprising at least one light emitting diode (101) arranged on a substrate (102) and facing a scattering reflector (103, 109) disposed at a distance from and extending along the extension of said substrate. The reflector comprises a plurality of non-parallel oriented reflective flakes (112) distributed in a transmissive carrier (113), such that light incident thereon from any angle of incidence is reflected and scattered. The scattering action of the reflector gives rise to an angular redistribution in the device, which increases the chance of light exiting the device through lateral openings between the reflector and the substrate, while the opacity of the reflector prevents light from being emitted through the top surface.

9 Claims, 1 Drawing Sheet

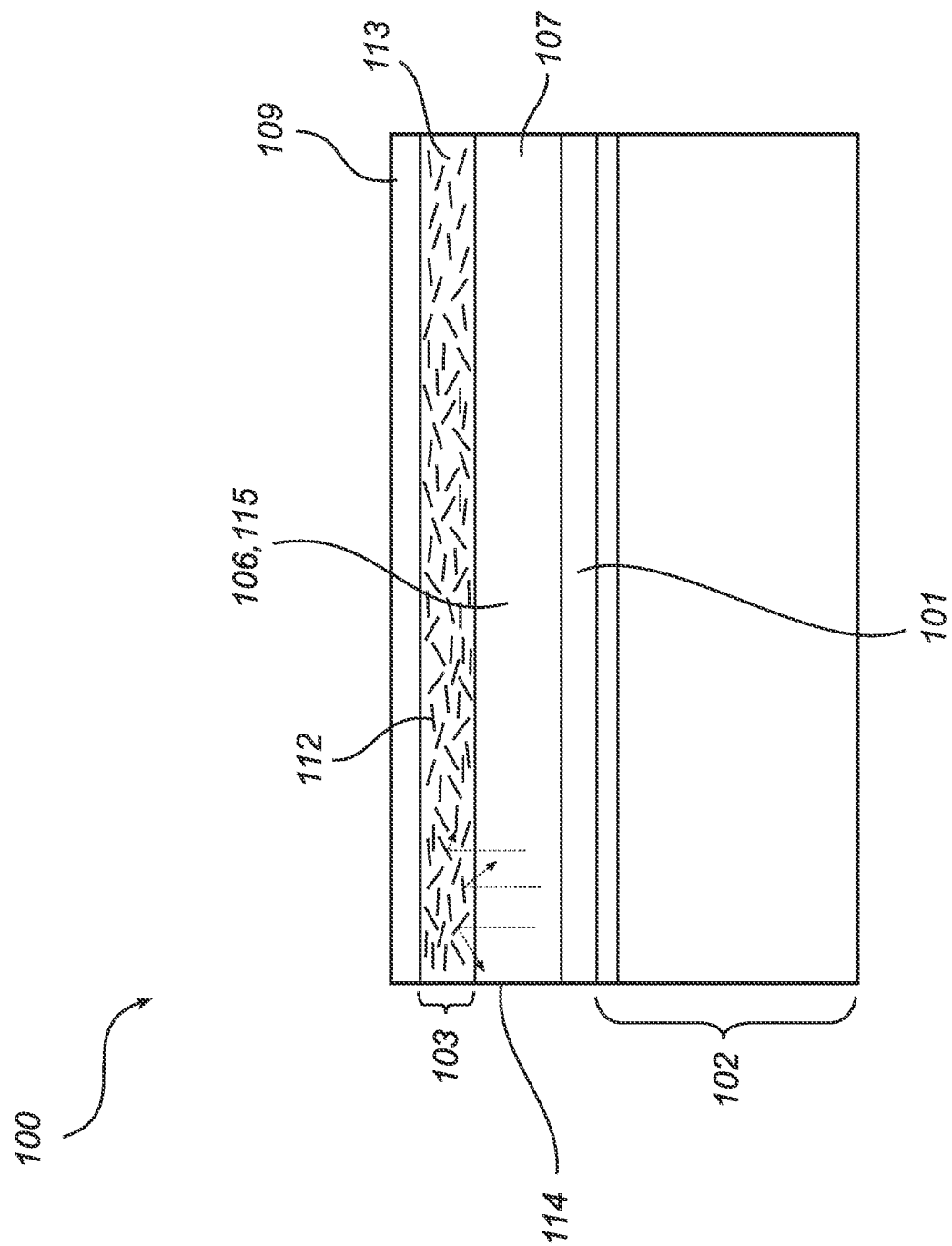

SIDE EMITTING DEVICE WITH HYBRID TOP REFLECTOR

FIELD OF THE INVENTION

The present invention relates to a side-emitting light emitting device comprising at least one light emitting diode arranged on a substrate and facing a scattering reflector disposed at a distance from and extending along the extension of said substrate.

BACKGROUND OF THE INVENTION

Colored LEDs as well as phosphor converted high power LEDs are attractive for use in large backlight panels as efficient high-brightness light sources. However, in certain applications, such as thin backlights for handheld display devices, such as mobile phones, PDAs and the like, it is desired to use thin side emitting light emitting devices as light sources.

A side emitting light emitting device is described in US 2006/0208269 A1, Kim et al, which describes a light emitting diode arranged on a substrate and under a reflective surface which is designed such that light from the light emitting diode is reflected towards the sides of the device by means of total internal reflection. Behind the reflective surface, on the opposite side from the LED, is arranged a scattering material in order to scatter and reflect back through the reflective surface light that has passed through the reflective surface, i.e. light not subject to total internal reflection on the reflective surface.

However, in order for the above device to work properly, the reflective surface must be slanted so that light coming from beneath is reflected to the sides by means of total internal reflection. Hence, the distance from the substrate to the reflecting surface must increase gradually towards the sides. This adds to the total thickness of the device. Further, in order to prevent light from leaving the scattering material through the top surface, the scattering material needs to have a substantial thickness, which also might add to the total thickness of the device.

Hence, there is a need in the art for thin, side emitting light emitting devices that do not emit light through the top surface.

SUMMARY OF THE INVENTION

It is an object of the present invention to at least partly overcome this problem, and to provide a side-emitting device that easily can be manufactured having a low thickness, while not emitting light through the top surface.

Hence, in a first aspect the present invention provides a side emitting light emitting device comprising at least one light emitting diode arranged on a substrate and facing an essentially opaque reflector disposed at a distance from and extending along the extension of said substrate. The reflector is essentially opaque and a scattering component, such that light incident thereon from any angle of incidence is reflected and scattered.

Light emitted by the LED is incident on the reflector, and independent on the angle of incidence it will be scattered and reflected. Since the reflector is essentially opaque, no substantial amount of light will exit the device through the reflector and hence, all light exiting the device must do so at the opening between the substrate and the reflector. Further, since the reflector is opaque, the scattering component of the reflector can be made just thick enough to achieve the desired scattering action. The scattering action gives rise to an angular redistribution in the device, which increases the chance of light exiting the device at all. Hence, a scattering reflector will increase the light extraction over a specular reflector.

The essentially opaque and scattering reflector comprises a plurality of non-parallel oriented reflective flakes distributed in a transmissive carrier.

The non-parallel alignment of the flakes provides both reflection and scattering of the light in a single layer, and the reflector can thus be made very thin. Further, it can simply be coated on the light propagation region when this is of a solid material.

In embodiments of the present invention, the reflective flakes are specular in order to present a high degree of reflection.

In embodiments of the present invention, a top reflector may be arranged on top of the reflector of reflective flakes distributed in a transmissive carrier. Such a top reflector may be used to reflect back into the device, any light that has passed through the scattering reflector towards the top surface thereof.

In embodiments of the present invention, a solid transmissive material may be arranged between the substrate and the reflector.

A solid transmissive material can result in a more efficient light extraction fro the LED as less light is reflected from the high refractive index LED material to a higher index solid layer that to for example, air. In addition, the critical angle of total internal reflection is increased by a solid body.

In embodiments of the present invention, the transmissive material may comprise a wavelength converting material.

When a wavelength converting material is arranged between the substrate and the reflector, the light emitted by the LED will be subject to wavelength conversion, and the color of the light output can be tailored to the need of the user, without increasing the size of the device or adding external elements to the device. In addition, the wavelength converting material has a scattering effect on the light, increasing the advantages of scattering in the device.

In embodiments of the present invention, the reflector may be arranged essentially parallel to the substrate. Due to the scattering effects of the scattering reflector, the reflector can be arranged parallel to the substrate, to give a thin device, while having a large portion of the light emitted to exit the device through the openings between the substrate and the reflector.

BRIEF DESCRIPTION OF THE DRAWING

This and other aspects of the present invention will now be described in more detail with reference to the appended drawing showing a currently preferred embodiment of the invention.

FIG. 1 illustrates schematically in cross-sectional view, one embodiment of a device of the present invention.

DETAILED DESCRIPTION

One embodiment of a side emitting light emitting device 100 of the present invention is schematically illustrated in FIG. 1 and comprises a light emitting diode, herein also denoted "LED" 101 and a substrate 102 on which the LED 101 is arranged. Not shown in this drawing, but also present in the device as conventional in the art is driving circuitry for the LED. A reflector 103 is arranged above the surface of the substrate 102 that the LED 101 is arranged. Hence, the LED 101 faces the reflector 103.

In this embodiment, the substrate 102 and the reflector 103 are illustrated as being essentially parallel, but as will follow from the description below, this is not necessary for all embodiments of the invention.

The substrate 102 and the reflector 103 form a lower and upper limit, respectively, for a light propagation region 115 disposed there between. The light propagation region 115 may be empty (vacuum), filled with a gas, liquid, gel, or with a solid transmissive material 106 for the light emitted by the LED to propagate within.

The device has at least one lateral opening 114 at least one lateral edge of the light propagation 115, and between the substrate and the reflector, through which opening(s) light emitted by the LED 101 and propagating in the light propagation region 115 may exit the device 100.

The light emitting diode 101 is arranged on the substrate 102. The light from the LED 101 typically has a substantial angular spread, such as emission in a half sphere pattern or lower spread, and has typically a main direction of light emission which is perpendicular from the surface of the substrate, a so called top emissive LED. However, other types of LEDs may also be used in a device of the present invention.

As used in this application, the term "light emitting diode" herein abbreviated "LED" refers to any type of light emitting diode or laser emitting diode known to those skilled in the art, including, but not limited to inorganic based LEDs, small organic molecule based LEDs (smOLEDs) and polymeric based LEDs (polyLEDs). In addition, photonic bandgap LEDs may also be used, which emits light in a narrower and tunable light cone. The light emitted by an LED suitable for use in the present invention is typically within the wavelength range of from UV light to visible light. For visible light, the emission may be of any color, from violet to red. Typically, blue light emitting LEDs are used in devices of the present invention.

The substrate 102 is a support for the LED 101 and may be of a multi layer structure. Typically, the substrate 102 comprises a layer that is reflective to the light emitted by the LED. The reflective layer may be a reflective backplane of the LED 101, which combines an electrode function with the reflective function, or may be a separate layer. The reflective layer typically comprises a metal, such as Ag or Al.

According to the general scope of the invention, the reflector 103 is essentially opaque. Further, it reflects and scatters light incident on the reflector, essentially no matter what angle of incidence the light has on the reflector.

Light emitted by the LED 101 is emitted having at least a component of the light directed towards the reflector 103, and upon encountering the reflector, the light is reflected back into the light propagation region, however, after this reflection being scattered, i.e. having a significantly higher angular spread, and having a significant deviation of light propagation from the incident light direction. Typically the angular spread after reflection in the reflector 102 is close to a half sphere spread. Due to this high spread, there is a good chance that light eventually will exit the device through the lateral openings 114. Scattering redistribution could also occur in the waveguiding layer, for example by having some scattering particles therein.

The degree of reflection in the reflector is typically in the range of R> about 80%, such as R> about 90%.

To obtain this highly reflective and scattering properties of the reflector, it comprises an essentially opaque specular component and one scattering component. Light from any angle of incidence on the reflector is scattered and reflected due to that the light is scattered before or simultaneously as it is being reflected. Meanwhile, since the reflective component is essentially opaque, essentially no light escapes out from the device through the top surface. In addition, since the reflective component is opaque, the scattering component can be held to a minimum, just having enough of it to provide the desired scattering. The scattering component can also contribute to the reflection by backscattering. The reflector may comprise several layers, including substrates used in the production of the reflector.

The reflector 103 in the embodiment in FIG. 1 will be described more in detail below.

The LED 101 emits light into the region between the substrate 102 and the reflector 103. This region is herein denoted as the light propagation region 115. A purpose of this light propagation region 115 is to lead the light from the LED 101 to the lateral openings 114. In this light propagation region, light is reflected back and forth between the reflective surfaces and will eventually exit the device through the lateral openings 114.

The light propagation region is preferably essentially transparent to light of the wavelengths emitted by the LED(s) of the device, such as not to absorb light in an appreciable extent.

The light propagation region 115 may be an open void, filled with any gas, such as e.g. air, or alternatively vacuum, or may be of a liquid, gel or solid material. Examples of solid materials suitable for use in a solid body light propagation region 115 include, but are not limited to solid inorganic materials, such as alumina, glass, fused silica, sapphire, and YAG, and silicones, fluoropolymers, polyolefins or other polymers. The solid body light propagation region 115 may further comprise an additional amount of scattering material to obtain a homogenous light distribution in the region.

In embodiments of the present invention, the solid body light propagation region 115 may, but does not necessarily, comprise wavelength converting material 107 arranged, such as distributed in the light propagation region 115, or may be formed from a wavelength converting material. Hence, a significant portion of the light exiting the light propagation region 115 will have been subject to the wavelength converting material 107.

The wavelength converting material 107 is a material which upon absorption of light of a certain wavelength or wavelength range, emits light of a different, converted, wavelength or wavelength range. Typically, the converted wavelengths are shifted towards longer wavelengths. Conventionally, such materials are typically fluorescent and/or phosphorescent. Many such wavelength converting materials are known to those skilled in the art, and one commonly used group of compound goes under the name "phosphors".

The wavelength converting material may for example be ceramic, solid materials or embedded in a binder material, such as a carrier polymer.

The wavelength converting material 107 is matched to the LED 101 such that it absorbs at least part of the light emitted by the LED. Hence, the selection of wavelength converting material depends on the selection of LED. For example, the wavelength converting material may partly convert blue light into green/yellow light, which mixes into white light. However, other wavelength converting materials may be used as well, for example fully converting blue into green, yellow or red, or converting UV-light into visible light.

The reflector 103 comprises a plurality of reflective, essentially opaque flakes 112 embedded and distributed in a transmissive carrier 113.

The reflective flakes 112 are preferably specular, but may alternatively be diffusive reflective.

The sizes of the flakes are typically in the order of a few micrometers, such as 1 to 100 μm, for example 1 to 10 μm, in width and up to 1 μm, such as from 0.05 to 1 μm, in thickness.

The flakes 112 typically consist of metal flakes, such as of aluminum or silver, or of e.g. polymeric flakes coated with a reflective coating, such as aluminum or silver.

The carrier 113, in which the flakes 112 are distributed, is preferably a transmissive carrier, such as for example a polymer or sol-gel carrier.

The flakes 112 are disposed in the carrier with non-parallel orientation. As used herein, the orientation of a flake 112 is interpreted as the plane of the flake's main surface. Non-parallel oriented flakes means that the flakes are generally not aligned to each other or to the main surfaces of the reflector 103, i.e. a certain degree of randomness is introduced in the orientation of the flakes. Of course, some individual flakes 112 may be oriented parallel to each other or to the surface of the main surface of the reflector 103, but such flakes are to be considered as exceptions.

As a result, the reflector 103, i.e. the flakes 112 of the reflector, will reflect light incident on the reflector in a random, i.e. scattering, way. The concentration of the flakes in the carrier and/or the thickness of the layer is such that the layer is essentially opaque, i.e. there should be no open passage for light through the layer without being reflected in the flakes. For each flake, it may hold that a very minor part of the light may leak through, though this is not preferred.

An additional top reflector 116, arranged on the reflector 103, may be used to absorb any light leaking through the flakes.

In the device of the present invention, a typical LED die size is about 1×1 mm, but also smaller or larger dimensions may be used. The typical thickness of the light propagation region is in the range of from about 10 µm to a few mm, such as from 10 µm to 2 mm, such as in the range of from 50 to 500 µm, typically about 300 µm.

The person skilled in the art realizes that the present invention by no means is limited to the preferred embodiments described above. On the contrary, many modifications and variations are possible within the scope of the appended claims. For example, in the drawings, the substrate and the reflector are illustrated as having their lateral edges coinciding with the lateral edges of the light propagation region. However, it is also possible that the lateral edges of at least one of the substrate and the reflector is outside of the light propagation region.

To summarize, a side-emitting light emitting device is provided, comprising at least one light emitting diode arranged on a substrate and facing an essentially opaque reflector disposed at a distance from and extending along the extension of said substrate. The reflector comprises a plurality of non-parallel oriented reflective flakes distributed in a transmissive carrier, such that light incident thereon from any angle of incidence is reflected and scattered.

The scattering action of the reflector gives rise to an angular redistribution in the device, which increases the chance of light exiting the device through lateral openings between the reflector and the substrate, while the opacity prevents light from being emitted through the top surface.

A light emitting device of the present invention may for example be used within the areas of LED-illumination, for example for back light application in display devices, in light guide applications, including flat light guide luminaries, LED collimator configurations, such as can be used for automotive head lighting or general LED-spot lighting. The areas of use are however not limited to the above.

The invention claimed is:

1. A side-emitting light emitting device, comprising at least one light emitting diode arranged on a substrate and facing a scattering reflector disposed at a distance from and extending along an extension of said substrate,
   wherein said reflector comprises a plurality of non-parallel oriented reflective flakes distributed in a transmissive carrier.

2. A light emitting device according to claim 1, wherein said reflective flakes are specular.

3. A light-emitting device according to claim 1, wherein a top reflector is arranged on top of said reflector.

4. A light-emitting device according to claim 1, wherein the thickness of said reflective flakes is in the range of from 0.05 to 1 µm.

5. A light emitting device according to claim 1 wherein the width of said reflective flakes is in the range of from 1 to 100 µm.

6. A light emitting device according to claim 1, wherein a solid transmissive material is arranged between said substrate and said reflector.

7. A light emitting device according to claim 1, wherein said transmissive material comprises a wavelength converting material.

8. A light emitting device according to claim 1, wherein said reflector is arranged parallel to said substrate.

9. A light emitting device according to claim 1, where said plurality of non-parallel oriented reflective flakes comprise a metal.

\* \* \* \* \*